United States Patent
Tarchinski et al.

(10) Patent No.: US 7,627,405 B2
(45) Date of Patent: Dec. 1, 2009

(54) PROGNOSTIC FOR LOSS OF HIGH-VOLTAGE ISOLATION

(75) Inventors: James E. Tarchinski, Rochester Hills, MI (US); Mike M. Mc Donald, Macomb, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 557 days.

(21) Appl. No.: 11/561,125

(22) Filed: Nov. 17, 2006

(65) Prior Publication Data

US 2008/0119976 A1 May 22, 2008

(51) Int. Cl.
*G01R 31/02* (2006.01)
*G06F 19/00* (2006.01)
(52) U.S. Cl. .................. 701/22; 701/1; 701/29; 318/479; 180/65.23
(58) Field of Classification Search ............ 701/22, 701/1, 29, 30; 322/22–23, 39; 318/432, 318/471, 479; 180/65.4, 65.23
See application file for complete search history.

(56) References Cited

U.S. PATENT DOCUMENTS 7,104,347 B2 * 9/2006 Severinsky et al. ....... 180/65.23
7,237,634 B2 * 7/2007 Severinsky et al. ....... 180/65.23

* cited by examiner

*Primary Examiner*—Tan Q Nguyen

(57) ABSTRACT

A method is provided for predicting a loss of high-voltage isolation within a hybrid, electric, or fuel cell vehicle. The method includes recording the equivalent resistance between a vehicle chassis and a high-voltage bus, detecting a trend in the measurements, and predicting when the resistance will drop below a threshold value. The method also includes issuing a warning or message to the owner/operator when the predicted remaining number of events drops below a predetermined number and/or when the resistance drops below the threshold. Additionally, an apparatus is provided for predicting a high-voltage isolation fault comprising a controller having an algorithm for predicting the fault, a high-voltage bus and bus components, and a reporting device for reporting the fault and/or predetermined number of remaining events. The controller is configured to initiate the algorithm and record a series of equivalent resistance measurements taken between the vehicle chassis and high-voltage bus.

16 Claims, 1 Drawing Sheet

PROGNOSTIC FOR LOSS OF HIGH-VOLTAGE ISOLATION

TECHNICAL FIELD

The present invention relates to a method and apparatus for predicting a future loss of high-voltage circuit isolation within a vehicle.

BACKGROUND OF THE INVENTION

In a vehicle having a gasoline/electric hybrid engine, the vehicle may be powered alternately by either a gasoline-powered internal combustion engine or an electric motor to thereby optimize fuel efficiency while reducing vehicle emissions. Hybrid vehicles achieve a relatively high fuel efficiency or fuel economy by alternating between the gasoline-powered engine and the electric motor when one power source is better suited to a specific vehicle operating condition than the other. For example, a gasoline-powered engine is known to be more efficient than an electric motor during periods of constant or relatively non-variable vehicle speed, such as while cruising at a sustained rate of speed, while an electric motor is generally better suited than a gasoline engine for use when the vehicle power requirements are highly variable, such as during starting or stopping of the vehicle.

Voltage requirements on board a hybrid vehicle and some electric and fuel cell vehicles may range from a standard 12-volt (V) supply to more than 600V, depending on the electrical device being energized or driven. For example, a low-voltage (12V) electrical system typically powers standard vehicle accessories such as stereo systems, clocks, headlights, wiper blades, and/or horns, while high-voltage (>60V) direct-current (DC) circuits may be needed to charge a battery or a battery pack to a level sufficient for powering the vehicle's drive wheels. To provide and safely control such a wide range of on-board voltage options, hybrid vehicles are configured with appropriate circuitry, wiring, and other electrical components such as voltage inverters and converters, specially manufactured high-voltage batteries, controllers, and various sensors. The high-voltage vehicle circuits are isolated from both the vehicle chassis and the low-voltage circuits.

SUMMARY OF THE INVENTION

Accordingly, a method is provided for predicting a future loss of high-voltage circuit isolation within a hybrid, electric, or fuel cell vehicle, the method including recording a series of discrete measurements of the equivalent electrical resistance taken between a vehicle chassis and a high-voltage bus upon the occurrence of an independent event, performing a data fitting analysis on the series of measurements to detect a trend in the data, and then using the data fit results to estimate or predict the number of independent events remaining before the equivalent resistance reaches a threshold amount.

In another aspect of the invention, the independent event is a key-down sequence initiated by a key or ignition cycle, and the series of measurements is recorded into a storage device comprising a circular buffer.

In another aspect of the invention, a warning or indication is communicated to the vehicle owner/operator if the threshold number of remaining independent events reaches a predetermined minimum.

In another aspect of the invention, an apparatus is provided for predicting a loss of high-voltage circuit isolation within a hybrid, electric, or fuel cell vehicle, the apparatus comprising a controller having memory and an algorithm for predicting an impending high-voltage isolation fault, a high-voltage bus, high-voltage bus components, and a reporting device operable for reporting an isolation fault, wherein the controller is configured to initiate the algorithm upon the occurrence of a predetermined independent event, recording a series of resistance measurements taken between the chassis and bus, and predicting the number of independent events remaining before the resistance reaches a predetermined threshold.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
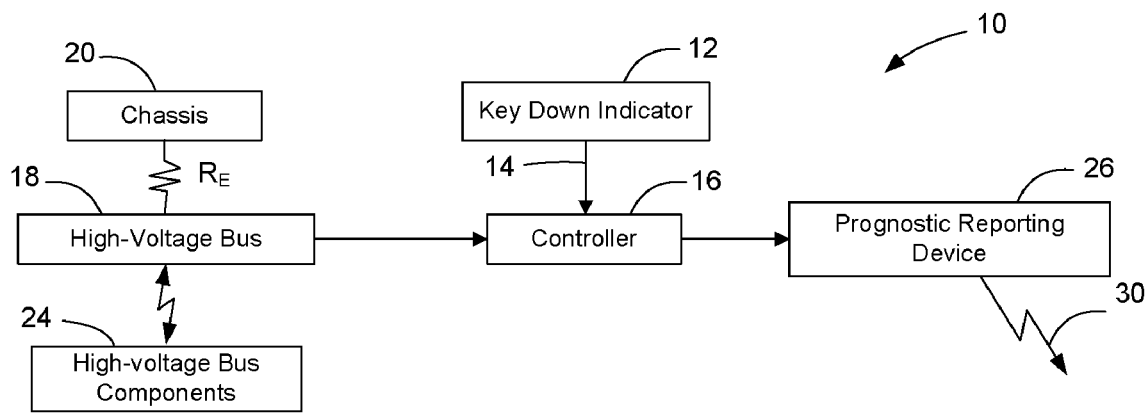
FIG. 1 is a block diagram showing a control apparatus according to the invention.

Referring to the drawings wherein like reference numbers correspond to like or similar components throughout the several figures, there is shown in FIG. 1 a block diagram of a high-voltage isolation prognostic control system 10 for use with a hybrid, electric, or fuel cell vehicle. The control system 10 is incorporated into or mounted with respect to a vehicle chassis 20 and includes a key-down indicator 12 configured to initiate and transmit an electrical key-down signal 14 to an integral control module or controller 16. The key-down signal 14 generated by key-down indicator 12 corresponds to the state or status of the vehicle's key switch or ignition and is of the type known in the art. For example, a common 0/1 binary signal generator with state 1 indicating a condition of "ignition switch on" and state 0 indicating a condition of "ignition switch off". The key-down signal 14 is communicated or transmitted to a controller 16 to initiate an algorithm 100 (see FIG. 2) once per key cycle, the algorithm 100 being embedded within or programmed into the controller 16.

The controller 16 is equipped with various electric circuit components configured for reading or measuring and then recording or storing a series of equivalent resistance ($R_E$) measurements taken between the vehicle chassis 20 and a high-voltage bus 18. The $R_E$ value may be expected to change or vary over the life of the hybrid vehicle due to age and associated physical deterioration and/or corrosion of the high voltage bus components 24, which are ordinarily exposed to water, heat, salt, and/or other external or environmental stresses during normal operation. High-voltage bus 18 is electrically connected to high-voltage bus components 24, with the components 24 being configured for control of, for example, motor/generator(s), auxiliary power sources, and power transmission between the various high-voltage components of the vehicle. High-voltage bus components 24 may include such electrical devices as DC-to-AC inverters, auxiliary power modules, and DC-to-DC converters. Additionally, the controller 16 is electrically connected to a prognostic reporting device (PRD) 26. The PRD 26 is operable to communicate a prognostic fault mode signal 30 detectable or receivable by a vehicle owner or operator. The communication of the fault mode signal 30 may take the form of, for example, illumination of a "check vehicle" lamp or light on a vehicle instrument panel, or initiation of an electronic message, e-mail, letter, or other electronic or paper-based textual warning alerting the owner/operator to the fault mode.

Figure 2:
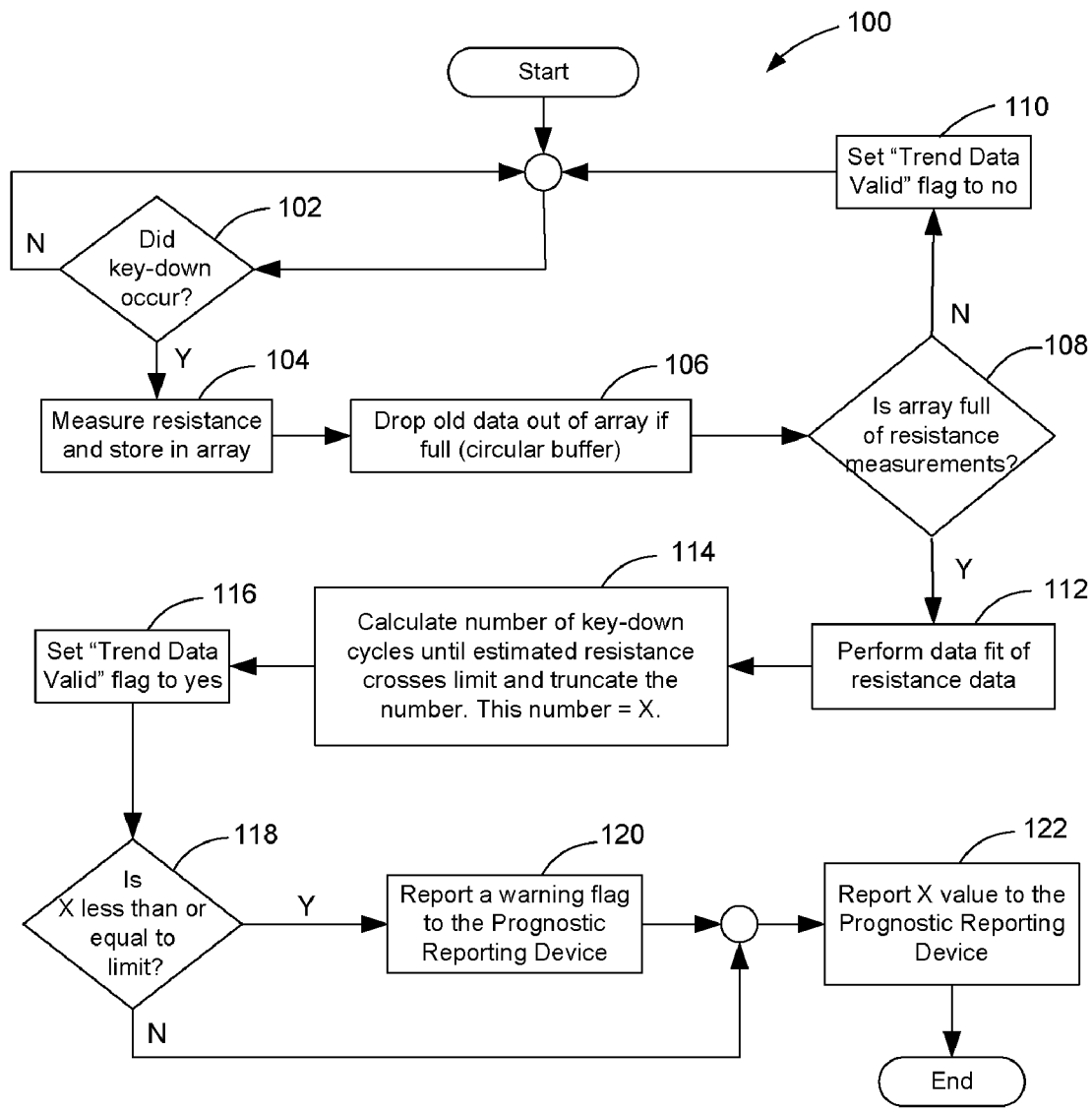
FIG. 2 is a flow chart describing the method or algorithm for providing a voltage isolation loss prognostic for a hybrid, electric, or fuel cell vehicle.

Referring now to FIG. 2, a method 100 (also referred to herein as algorithm 100) is shown for generating a high-voltage isolation prognostic signal within a hybrid, electric, or fuel cell vehicle. Algorithm 100 is preferably a computer program or source code embedded or contained within the controller 16 (see FIG. 1), with the algorithm 100 being initiated and executed upon the occurrence of each consecutive and discrete independent event, preferably a vehicle key-down sequence or key cycle. While the key-down sequence, i.e. the ignition on/off state change described previously hereinabove with respect to the key-down indicator 12, is used as the preferred independent variable within algorithm 100, those skilled in the art will recognize that other events may be suitable for use as the independent variable within the scope of the invention, including predetermined vehicle odometer readings, real-time counting devices or timers, or other devices capable of initiating a key-down sequence at a predetermined and preferably regular interval.

At step 102 of algorithm 100, the algorithm determines whether a key-down sequence or state change has occurred within the key-down indicator 12 (see FIG. 1). This step is implemented to ensure that algorithm 100 continues beyond step 102 only as a result of a predetermined key-down sequence initiating event such as the ignition switch being turned off. If at step 102 a predetermined key-down sequence has not fully occurred, the algorithm 100 repeats step 102. However, if at step 102 it is determined that the predetermined key-down sequence has been completed, the algorithm 100 proceeds to step 104.

At step 104, the algorithm 100 reads or measures the current or instantaneous equivalent resistance $R_E$ (see FIG. 1) between the vehicle chassis 20 and the high-voltage bus 18, and then stores the $R_E$ value in a storage array within the memory of the controller 16. The storage array is preferably a circular buffer having a capacity defined by a predetermined fixed number of $R_E$ samples, with the preferred number of samples being approximately 25 to 35. However, any number of samples may be used to define the array size provided the selected sample size is sufficient for establishing or detecting a trend or pattern in the series of recorded $R_E$ values.

At step 106, the algorithm 100 determines if the array or buffer is filled to capacity, i.e. the array or buffer holds the maximum number of $R_E$ values. If the storage array is determined to be at capacity, the oldest $R_E$ sample in the array is deleted, dropped, or overwritten, and the latest $R_E$ value is added to the array. If, however, the array is not at capacity at the time the most recent $R_E$ sample value is generated and recorded, the most recent sample is simply added to the array.

At step 108, the algorithm 100 compares the array capacity to the number of samples held therein and determines whether the array is full. If the number of $R_E$ samples held or recorded within the array is less than the array capacity, the algorithm proceeds to step 110, in which a "trend data valid" flag is set to a condition corresponding to "off" or "no", and algorithm 100 starts over from step 102. If, however, the number of samples held within the array is equal to the array capacity, the algorithm 100 proceeds to step 112.

In step 112, the algorithm 100 performs a numerical data fitting procedural step on the series of $R_E$ samples stored in the array. Second order or quadratic least squares regression is the preferred method of data fitting routine, however those skilled in the art will recognize that other data fitting routines may be suitable for use with this invention. This step is implemented as a preparatory or preliminary step toward detecting or projecting a trend or pattern in the series of $R_E$ samples. Once the data fitting routine is complete, the algorithm 100 proceeds to step 114.

In step 114, the algorithm 100 looks to the trend result of the least squares regression analysis of step 112 and then, based on that trend, calculates or determines the estimated number of key-down cycles remaining before the isolation resistance $R_E$ drops below or is less than a predetermined limit or threshold value $R_{Emin}$. This threshold $R_{Emin}$ value is programmed into the controller 16 (see FIG. 1), and the predicted or estimated remaining key-down cycle number is truncated into an integer, represented hereinafter by the variable X. After algorithm 100 determines the variable X, the "trend data valid" flag is re-set to "on" or "yes" in step 116. The algorithm then proceeds to step 118.

In step 118, the variable X is compared to a predetermined key-down cycle limit $X_{min}$. If the value of X is determined to be less than or equal to $X_{min}$, the algorithm 100 proceeds to step 120, in which a warning flag is generated and communicated or transmitted to the PRD 26. If, however, the value of X is greater than $X_{min}$, the algorithm 100 bypasses step 120 and proceeds directly to step 122.

In step 122, the algorithm 100 communicates or transmits the value of variable X, that is, the projected number of remaining key-down cycles, to the PRD 26 (see FIG. 1). Regardless of whether a warning flag has been generated in the preceding step 120, the PRD 26 records the variable X in the storage array. The PRD 26 also preferably reports or displays the value of variable X when X is less than or equal to a predetermined display threshold $X_d$. In this manner, the owner/operator of the vehicle receives not only a timely warning of an existing or immediate high-voltage isolation fault, but also an estimate of the number of independent events remaining until the isolation resistance value $R_E$ surpasses the predetermined resistance threshold $R_{Emin}$, without being subjected to unnecessarily early warnings or alarms. In the event an owner/operator desired access to the stored resistance values $R_E$ or the variable X prior to display, these values are preferably readily detectable by probing or tapping the memory of controller 16.

While the best modes for carrying out the invention have been described in detail, those familiar with the art to which this invention relates will recognize various alternative designs and embodiments for practicing the invention within the scope of the appended claims.

The invention claimed is:

1. A method for predicting a loss of high-voltage circuit isolation in a hybrid, electric, or fuel cell vehicle, the method comprising:
   measuring a series of equivalent electrical resistance level readings taken between a chassis and a high-voltage bus of said vehicle, wherein each element of said series is measured upon the occurrence of a discrete, predetermined independent event;
   performing a data fitting analysis on said series to detect a numerical trend within said series; and
   using said trend to determine the estimated number of remaining independent events before said electrical resistance will be less than a predetermined threshold resistance.

2. The method of claim 1, wherein said independent event is a key-down sequence.

3. The method of claim 1, wherein said series is recorded into a storage device.

4. The method of claim 3, wherein said storage device is a circular buffer having a capacity of approximately 25 to 35 measurements.

5. The method of claim 1, wherein said data fitting analysis is second order least-squares regression.

6. The method of claim 1, including a recording device, wherein said recording device is configured to generate an audio or visual warning when said number of remaining independent events reaches a predetermined threshold.

7. A method for predicting a loss of high-voltage circuit isolation within a hybrid vehicle having a chassis and a high-voltage bus, the method comprising:
 determining whether a predetermined independent variable event has occurred;
 measuring and recording an equivalent resistance value taken between said chassis and said high-voltage bus;
 storing said value in a storage array until said array reaches a predetermined sample population;
 performing a data fitting analysis on said sample population to detect a trend in said population; and
 using said trend to calculate the number of said independent events remaining until said equivalent resistance is less than a predetermined threshold value.

8. The method of claim 7, wherein said independent event is a key-down sequence.

9. The method of claim 7, wherein said series is recorded into a storage device.

10. The method of claim 9, wherein said storage device is a circular buffer having a capacity of approximately 25 to 35 measurements.

11. The method of claim 7, wherein said data fitting analysis is second order least-squares regression.

12. The method of claim 7, including a reporting device, wherein said device is configured to communicate a warning when said number of remaining events reaches a predetermined threshold value.

13. An apparatus for predicting a loss of high-voltage circuit isolation within a hybrid vehicle having a chassis and a high-voltage bus, the apparatus comprising:
 a controller having memory and a control algorithm for predicting a high-voltage isolation fault;
 a plurality of high-voltage bus components operatively connected to said high-voltage bus; and
 a reporting device operable for reporting said predicted high-voltage isolation fault; wherein said controller is configured to initiate said algorithm upon the occurrence of a predetermined independent event, said algorithm including recording into said memory a series of periodic measurements of the equivalent resistance between said chassis and said bus, and predicting the number of said events remaining before said resistance reaches a predetermined threshold.

14. The apparatus of claim 13, wherein said reporting is selected from the group consisting of an instrument panel indicator lamp, textual message, and audible signal.

15. The apparatus of claim 13, wherein said memory is a circular buffer having a capacity of approximately 25 to 35 measurements.

16. The apparatus of claim 13, wherein said predetermined independent event is a key-down sequence.

* * * * *